United States Patent
Agarwal et al.

(10) Patent No.: US 11,742,301 B2
(45) Date of Patent: Aug. 29, 2023

(54) FAN-OUT PACKAGE WITH REINFORCING RIVETS

(71) Applicant: ADVANCED MICRO DEVICES, INC., Santa Clara, CA (US)

(72) Inventors: Rahul Agarwal, Livermore, CA (US); Milind S. Bhagavat, Los Altos, CA (US); Priyal Shah, San Jose, CA (US); Chia-Hao Cheng, Hsinchu (TW); Brett P. Wilkerson, Austin, TX (US); Lei Fu, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/544,021

(22) Filed: Aug. 19, 2019

(65) Prior Publication Data

US 2021/0057352 A1    Feb. 25, 2021

(51) Int. Cl.
| | | |
|---|---|---|
| *H01L 23/00* | (2006.01) | |
| *H01L 23/31* | (2006.01) | |
| *H01L 23/538* | (2006.01) | |
| *H01L 21/48* | (2006.01) | |
| *H01L 21/56* | (2006.01) | |

(52) U.S. Cl.
CPC ........ *H01L 23/562* (2013.01); *H01L 21/4853* (2013.01); *H01L 21/4857* (2013.01); *H01L 21/565* (2013.01); *H01L 23/3128* (2013.01); *H01L 23/5381* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/3511* (2013.01); *H01L 2924/35121* (2013.01)

(58) Field of Classification Search
CPC ............... H01L 23/562; H01L 23/5383; H01L 23/5381; H01L 23/5386; H01L 21/4853; H01L 24/19; H01L 21/4857; H01L 23/3128; H01L 24/20; H01L 23/5389; H01L 21/565; H01L 2924/3511; H01L 2224/214; H01L 2924/35121; H01L 21/6835
See application file for complete search history.

(56) References Cited

U.S. PATENT DOCUMENTS 9,478,504 B1    10/2016  Shen et al.
10,262,967 B2 *  4/2019  Hwang .................. H01L 24/20
(Continued)

OTHER PUBLICATIONS

Ron Huemoeller et al.; *Silicon Wafer Integrated Fan-Out Technology*; ChipScaleReview.com; Mar. & Apr. 2015; pp. all.

*Primary Examiner* — John P. Dulka

(57) ABSTRACT

Various semiconductor chip packages are disclosed. In one aspect, a semiconductor chip package is provided that includes a fan-out redistribution layer (RDL) structure that has plural stacked polymer layers, plural metallization layers, plural conductive vias interconnecting adjacent metallization layers of the metallization layers, and plural rivets configured to resist delamination of one or more of the polymer layers. Each of the plural rivets includes a first head, a second head and a shank connected between the first head and the second head. The first head is part of one of the metallization layers. The shank includes at least one of the conductive vias and at least one part of another of the metallization layers.

20 Claims, 11 Drawing Sheets

(56) References Cited

U.S. PATENT DOCUMENTS

| | | |
|---|---|---|
| 2002/0172026 A1 | 11/2002 | Chong et al. |
| 2003/0016133 A1 | 1/2003 | Egbert |
| 2006/0003579 A1* | 1/2006 | Sir .................. H05K 3/424 |
| | | 438/639 |
| 2007/0102791 A1* | 5/2007 | Wu ................. H01L 23/585 |
| | | 257/618 |
| 2009/0135574 A1 | 5/2009 | Tanaka et al. |
| 2011/0006389 A1* | 1/2011 | Bachman .......... H01L 23/3128 |
| | | 257/E21.294 |
| 2011/0010932 A1 | 1/2011 | Tanaka et al. |
| 2012/0007211 A1 | 1/2012 | Aleksov et al. |
| 2012/0286419 A1 | 11/2012 | Kwon et al. |
| 2013/0049127 A1 | 2/2013 | Chen et al. |
| 2013/0062760 A1 | 3/2013 | Hung et al. |
| 2013/0168854 A1 | 7/2013 | Karikalan et al. |
| 2014/0102768 A1 | 4/2014 | Shizuno et al. |
| 2014/0264791 A1 | 9/2014 | Manusharow et al. |
| 2014/0332966 A1 | 11/2014 | Xiu et al. |
| 2015/0001717 A1 | 1/2015 | Karhade et al. |
| 2015/0001733 A1 | 1/2015 | Karhade et al. |
| 2015/0048515 A1 | 2/2015 | Zhang et al. |
| 2015/0092378 A1 | 4/2015 | Roy et al. |
| 2015/0228583 A1 | 8/2015 | Karhade et al. |
| 2015/0245484 A1* | 8/2015 | Ryu .................. H05K 1/0271 |
| | | 174/262 |
| 2015/0340459 A1 | 11/2015 | Lee |
| 2016/0085899 A1 | 3/2016 | Qian et al. |
| 2016/0181189 A1 | 6/2016 | Qian et al. |
| 2016/0300800 A1* | 10/2016 | Zeng .................. H01L 22/34 |
| 2018/0040546 A1 | 2/2018 | Yu et al. |
| 2018/0053732 A1* | 2/2018 | Baek ................ H01L 23/5389 |
| 2019/0333851 A1* | 10/2019 | Agarwal ............. H01L 21/565 |
| 2021/0020584 A1* | 1/2021 | Yu ................... H01L 21/6835 |
| 2022/0352094 A1* | 11/2022 | Liu .................... H01L 24/81 |

* cited by examiner

FAN-OUT PACKAGE WITH REINFORCING RIVETS

BACKGROUND OF THE INVENTION

A conventional type of multi-chip module includes two semiconductor chips mounted side-by-side on a carrier substrate or in some cases on an interposer (so-called "2.5D") that is, in-turn, mounted on a carrier substrate. The semiconductor chips are flip-chip mounted to the carrier substrate and interconnected thereto by respective pluralities of solder joints. The carrier substrate is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion (CTE) of the chips, the interposer and the solder joints.

One conventional variant of 2.5D interposer-based multi-chip modules uses a silicon interposer with multiple internal conductor traces for interconnects between two chips mounted side-by-side on the interposer. The interposer is manufactured with multitudes of through-silicon vias (TSVs) to provide pathways between the mounted chips and a package substrate upon which the interposer is mounted. The TSVs and traces are fabricated using large numbers of processing steps.

Another conventional multi-chip module technology is 2D wafer-level fan-out (or 2D WLFO). Conventional 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using conventional redistribution layer (RDL) processing. Conventional 3D WLFO extends the 2D technology into multi-chip stacking where a second package substrate is mounted on the 2D WLFO.

Some other conventional designs use embedded interconnect bridges (EMIB). These are typically silicon bridge chips (but occasionally organic chiplets with top side only input/outputs) that are embedded in the upper reaches of a package substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
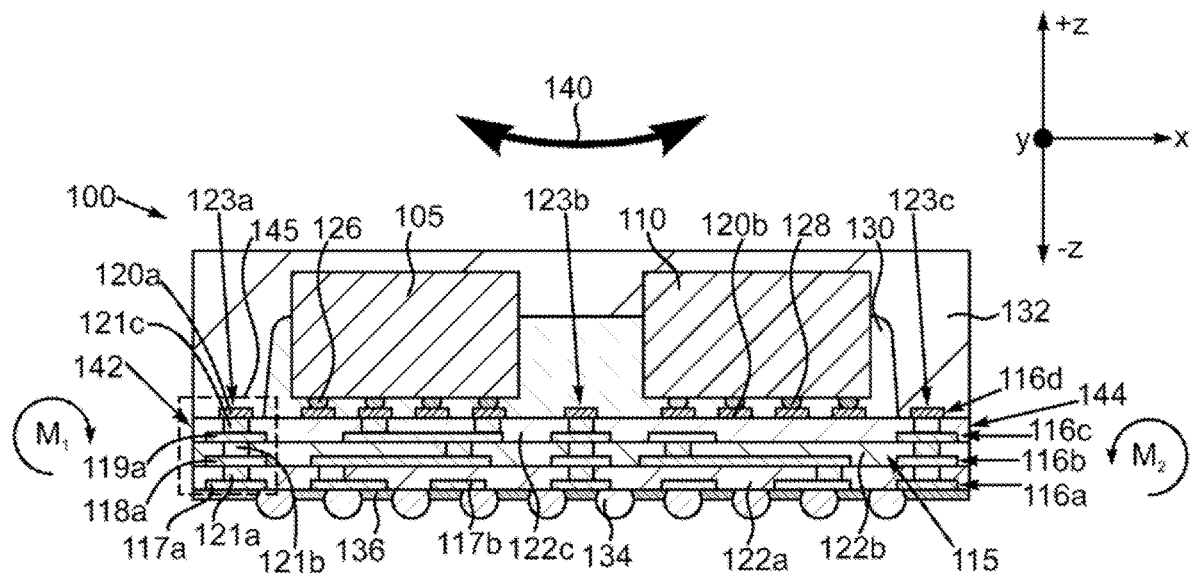
FIG. 1 is a sectional view of an exemplary arrangement of a semiconductor chip package.

Chip geometries have continually fallen over the past few years. However the shrinkage in chip sizes has been accompanied by an attendant increase in the number of input/outputs for a given chip. This has led to a need to greatly increase the number of chip-to-chip interconnects for multi-chip modules. Current 2D and 3D WLFO have limited minimum line spacing, on the order of 2.0 µm/line and space. In addition, conventional WLFO techniques use multiple cured polyimide films to create the requisite RDL layers. These polyimide films tend to be mechanical stress, and thus warpage, sources and their relatively high bake temperatures can adversely impact other sensitive devices. Pick and place accuracy of chips in both WLFO and EMIB remains a challenge.

In addition to the stress and warpage associated with multiple polyimide films, additional warpage stresses can be imparted due to the differing mechanical properties, such as CTE, modulus, and glass transition temperature, of the various RDL layers, underfills, metal layers, solder structures and semiconductor chips that make up a fan-out package. These warpage stresses, if unchecked, can lead to delamination of one or more of the multiple polymer layers that make up the fan-out RDL structure.

The disclosed new arrangements provide mechanical reinforcements in the fan-out RDL structure that inhibit the delamination of one or more of the RDL polymer layers. These reinforcements are fabricated as rivets. An exemplary rivet includes two heads interconnected by a shank. Some of the heads can be made from conductor pads and/or traces of the fan-out RDL and the shanks made from intervening pads/traces and vias of the fan-out RDL structure. In other arrangements, conductive pillars can be used for one of the rivet heads and a conductor pad for the other rivet head.

In accordance with one aspect of the present invention, a semiconductor chip package is provided that includes a fan-out redistribution layer (RDL) structure that has plural stacked polymer layers, plural metallization layers, plural conductive vias interconnecting adjacent metallization layers of the metallization layers, and plural rivets configured to resist delamination of one or more of the polymer layers. Each of the plural rivets includes a first head, a second head and a shank connected between the first head and the second head. The first head is part of one of the metallization layers. The shank includes at least one of the conductive vias and at least one part of another of the metallization layers.

In accordance with another aspect of the present invention, a semiconductor chip package is provided that includes a fan-out redistribution layer (RDL) structure that has plural stacked polymer layers, plural metallization layers, plural conductive vias interconnecting adjacent metallization layers of the metallization layers, and plural rivets configured to resist delamination of one or more of the polymer layers. Each of the metallization layers includes plural conductor pads and conductor traces and each of the plural rivets includes a first head, a second head and a shank connected between the first head and the second head. The first head is one of the conductor pads of one of the metallization layers. The shank includes at least one of the conductive vias and at least one part of another of the metallization layers.

In accordance with another aspect of the present invention, a method of manufacturing is provided that includes fabricating a fan-out redistribution layer (RDL) structure that has plural stacked polymer layers, plural metallization layers, plural conductive vias interconnecting adjacent metallization layers of the metallization layers, and plural rivets configured to resist delamination of one or more of the polymer layers. Each of the plural rivets includes a first head, a second head and a shank connected between the first head and the second head, the first head being part of one of the metallization layers, the shank including at least one of the conductive vias and at least one part of another of the metallization layers.

In the drawings described below, reference numerals are generally repeated where identical elements appear in more than one figure. Turning now to the drawings, and in particular to FIG. 1, therein is depicted a sectional view of an exemplary arrangement of a semiconductor chip package 100 that includes one or more semiconductor chips, two of which are shown and labeled 105 and 110, respectively, mounted on a fan-out redistribution layer (RDL) structure 115 that functions as a package substrate. The semiconductor chips 105 and 110 can number other than two. None of the arrangements disclosed herein is reliant on particular functionalities of the semiconductor chips 105 and 110. Thus, the semiconductor chips 105 and 110 can be any of a variety of different types of circuit devices used in electronics, such as, for example, interposers, microprocessors, graphics processors, combined microprocessor/graphics processors, application specific integrated circuits, memory devices or the like, and can be single or multi-core. The semiconductor chips 105 and 110 can be constructed of bulk semiconductor, such as silicon or germanium, or semiconductor-on-insulator materials, such as silicon-on-insulator materials or even insulator materials. Thus, the term "semiconductor chip" even contemplates insulating materials. Stacked dice can be used if desired.

The RDL structure 115 includes plural metallization layers 116a, 116b, 116c and 116d. The metallization layer 116a includes plural conductor pads and/or traces, a couple of which are numbered 117a and 117b, respectively. The metallization layer 116b includes plural conductor pads and/or traces 118a, the metallization layer 116c includes plural conductor pads and/or traces 119a and the metallization layer 116d includes plural conductor pads and/or traces 120a and 120b. The metallization layers 116a and 116b are electrically connected by plural conductive vias 121a. The metallization layers 116b and 116c are electrically connected by plural conductive vias 121b and the metallization layers 116c and 116d are electrically connected by plural conductive vias 121c. The metallization layer 116a and the conductive vias 121a are positioned in a polymer layer 122a, the metallization layer 116b and the conductive vias 121b are positioned in a polymer layer 122b positioned on the polymer layer 122a and the metallization layer 116c and the conductive vias 121c are positioned in a polymer layer 122c positioned on the polymer layer 122b. The metallization layer 116d is positioned above the polymer layer 122c.

The conductor structures of the semiconductor chip package 100 can be constructed of various conductor materials, such as copper, aluminum, silver, gold, platinum, palladium, laminates of these or others. Various well-known techniques for applying metallic materials can be used, such as plating, physical vapor deposition, chemical vapor deposition, or the like. Solder structures of the semiconductor chip package 100 and other solder structures disclosed herein can be composed of various well-known solder compositions, such as tin-silver, tin-silver-copper or others. Solder application techniques, such as stencil, plating, pick and place or other can be used.

The RDL structure 115 is reinforced against the potential delamination of one or more of the polymer layers 122a, 122b and 122c by way of plural rivets 123a, 123b and 123c that are interspersed in the RDL structure 115. As described in more detail below, the rivets 123a, 123b and 123c are constructed of metal pads and/or traces and vias of the metallization layers 116a, 116b, 116c and 116d. For example, the rivet 123a is made up from the conductor pad and/or trace 117a, the conductive via 121a, the conductor pad and/or trace 118a, the conductive via 121b, the conductor pad and/or trace 119a, the conductive via 121c and the conductor pad and/or trace 120a. The rivets 123b and 123c are similarly constructed. While the conductor trace and/or pad 117a forms part of the rivet 123a, others, such as the conductor trace and/or pad 117b, provide routing for the RDL structure 115. Additional details about the rivets 123a, 123b and 123c will be described below.

The semiconductor chip 105 is electrically connected to various conductors of the upper most metallization layer 116d by way of plural interconnects 126, which can be solder bumps, micro bumps or other types of interconnect structures. The semiconductor chip 110 is similarly connected to other of the conductor structures of the metallization layer 116d by way of interconnect structures 128. An underfill material 130 is interposed between the semiconductor chips 105 and 110 and the RDL structure 115. The semiconductor chips 105 and 110 can be partially or completely encapsulated by a molding layer 132. It is desirable for the materials selected for the molding layer 132 to exhibit suitable viscosity at the applicable molding temperatures and have molding temperatures lower than the melting points of any of the solder structures present at the time of the molding processes. In an exemplary arrangement the materials for the molding layer 132 can have a molding temperature of about 165° C. Two commercial variants of epoxy resin for the molding layer 132 are SUMITOMO® EME-G750 and G760. To cushion against the effects of mismatched coefficients of thermal expansion, the underfill material 130 can be positioned between the semiconductor chips 105 and 110 and the RDL structure 115 and can extend laterally beyond the left and right edges (and those edges not visible) of the chips 105 and 110 as desired. The underfill material 130 can be composed of well-known polymeric underfill materials, such as epoxies or others.

The RDL structure 115 can interface electrically with some other structure, such as a circuit board, by way of plural interconnects 134, which can be solder balls, bumps, micro bumps, pillars or other types of interconnect structures. The interconnect structures 134 are electrically connected to the lower most metallization layer 116a and project through a solder resist layer 136 that is fabricated on the underside of the polymer layer 122a.

Figure 2:
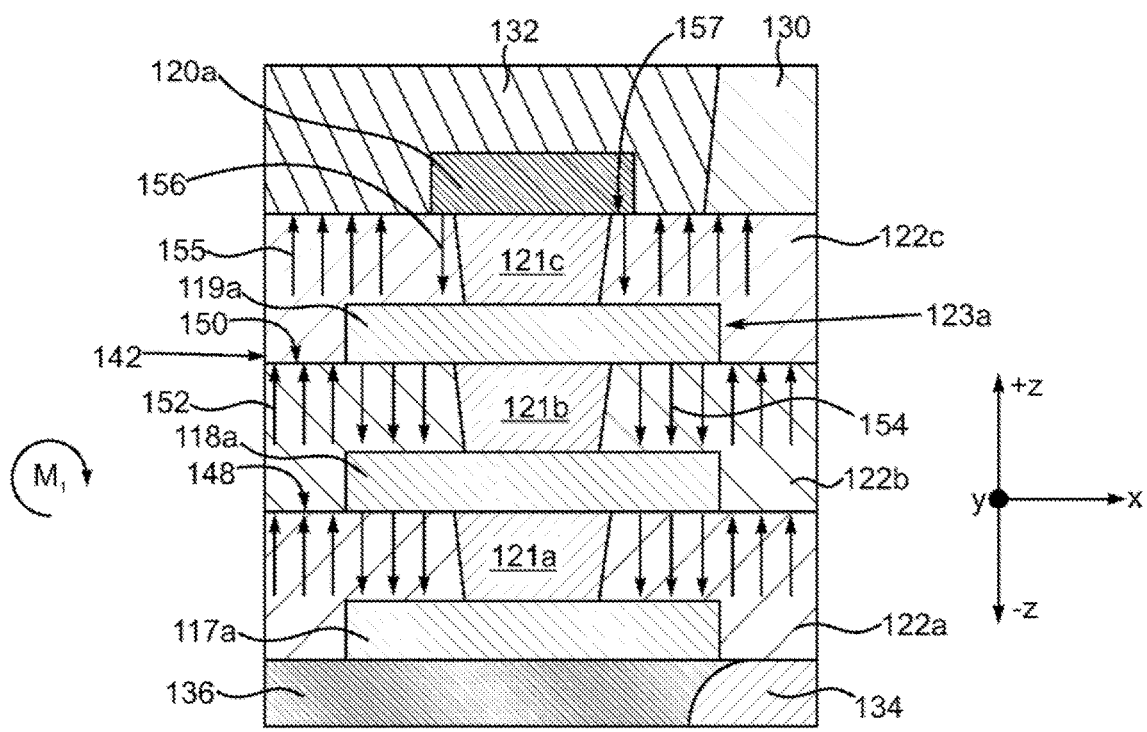
FIG. 2 is a portion of FIG. 1 shown at greater magnification.

As noted briefly above, the RDL structure 115 is fabricated with the rivets 123a, 123b and 123c in order to combat the potential delaminating effects of warpage. For example, assume for the purposes of this discussion that the semiconductor chip package 100 and in particular the RDL structure 115 exhibits an upward warpage as represented schematically by the large black arrow 140. This warpage produces bending moments $M_1$ and $M_2$ at the edges 142 and 144 of the RDL structure 115. Of course, similar opposing bending moments could be present at the edges (not visible) that are orthogonal to the edges 142 and 144. The edges 142 and 144 will be moved in the +z direction. If any of the polymer layers 122a, 122b or 122c delaminate, they will tend to deflect in the +z direction. If the direction of warpage is opposite of the arrow 140, then the deflections would be in the −z direction. Additional details of the rivet 123a can be understood by referring now also to FIG. 2, which depicts the portion of FIG. 1 circumscribed by the dashed rectangle 145, albeit at greater magnification, and to FIG. 2, which is an exploded pictorial view of the rivet 123a. The following discussion of the rivet 123a will be illustrative of the other rivets 123b and 123c as well. Note that because of the location of the dashed rectangle 145 in FIG. 1, FIG. 2 depicts the rivet 123a and small portions of the polymer layers 122a, 122b and 122c, the underfill 130, the molding 132, one of the interconnects 134 and the solder resist layer 136. A typical rivet includes a shank connected to two oppositely positioned heads. For the rivet 123a, one of the conductor traces and/or pads 117a of the metallization layer 116a serves as a rivet head and one of conductor traces and/or pads 120a serves as the other rivet head. The combination of the conductive vias 121a, 121b and 121c and the conductor traces and/or pads 118a and 119a function as the shank of the rivet 123a. The conductor structures of the rivet 123a are metallurgically bonded and make up a mechanical structure capable of resisting tensile stresses, for example, along the z axis. This illustrative arrangement of the rivet 123a is designed to provide delamination protection for the interface 148 between the polymer layer 122a and the polymer layer 122b and the interface 150 between the polymer layer 122b and the polymer layer 122c. If the warpage produces the aforementioned bending moment $M_1$, then the polymer layer 122b will have a tendency to warp particularly at the edge 142 in the +z direction and exert positive +z direction force 152 against the conductor trace and/or pad 119a and the polymer layer 122c. However, this upward force 152 will be opposed by a downward force 154 provided by the conductor trace and/or pad 119a. In addition, the polymer layer 122c will, due to the bending moment $M_1$, produce an upward force 155 that bears against the molding layer 132, a portion of the underfill 130 and the conductor trace and/or pad 120a which, as noted above, is serving as the upper head of the rivet 123a. A lip 157 of the conductor trace and/or pad 120a facing in the −z direction exerts a downward force 156, which counteracts the upward force and bending tendency of both the polymer layer 122c and the polymer layer 122b. Of course if the lowermost conductor trace and/or pad 117a, which functions as one of the rivet heads, were positioned below the polymer layer 122a, then potential delamination of the polymer layer 122a from whatever lies beneath would also be counteracted.

Figure 3:
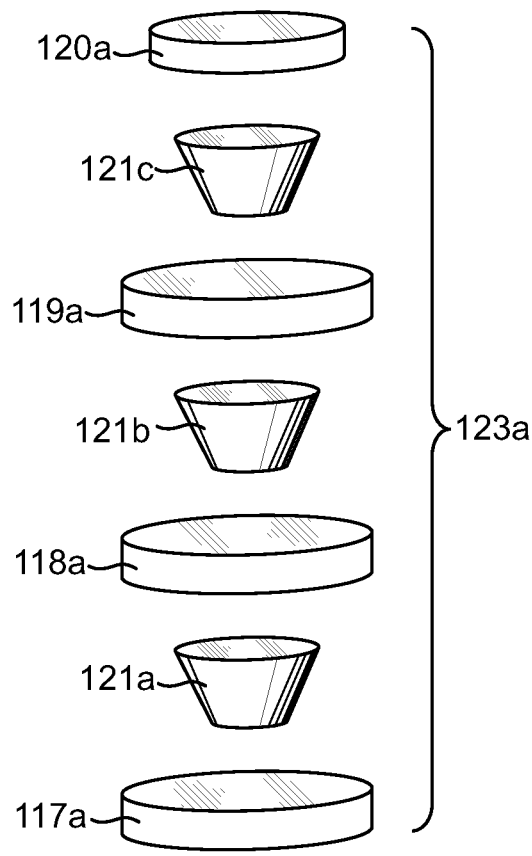
FIG. 3 is an exploded pictorial view of an exemplary rivet of the semiconductor chip package shown in FIGS. 1 and 2.

FIG. 3 depicts an exploded pictorial view of the exemplary rivet 123a. As noted above, the rivet 123a includes the metallization trace 117a, the via 121a, the metallization trace 118a, the via 121b, the metallization trace 119a, the via 121c and the metallization trace 120a, where, as noted above, the metallization traces 117a and 120a function as rivet heads and the metal structures between the traces 117a and 120a function as the rivet shank. Here, the metallization traces 117a, 118a, 119a and 120a and the vias 121a, 121b and 121c are generally circular in footprint and the vias 121a, 121b and 121c have a tapered profile. However, the skilled artisan will appreciate that other footprints such as square, rectangular or other and other profiles can be used for this and the other disclosed arrangements.

Figure 4:
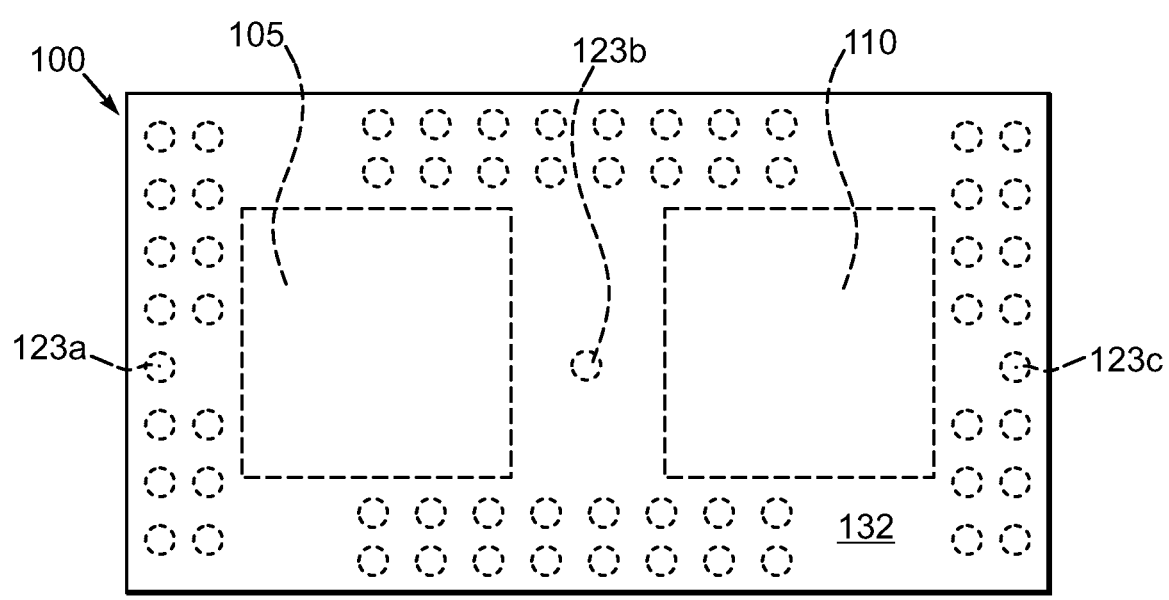
FIG. 4 is a plan view of the exemplary semiconductor chip package.

The rivets 123a, 123b and 123c of this and other disclosed arrangements can number other than three and be distributed in various locations in the semiconductor chip package 100. For example, FIG. 4 depicts a plan view of the semiconductor chip package 100 and shows the rivets 123a, 123b and 123c as well as additional rivets that are not numbered. The rivets 123a, 123b and 123c and the semiconductor chips 105 and 110 are shown in phantom since they are positioned beneath the molding layer 132. The rivets 123a, 123b and 123c can be fabricated wherever it will not interfere with electrical routing for power/ground and signals between the semiconductor chips 105 and 110 and the RDL structure 115 depicted in FIG. 1. In this exemplary arrangement, the rivets 123a, 123b and 123c are discrete structures and electrically floating. In others to be described, they are not.

Figure 5:
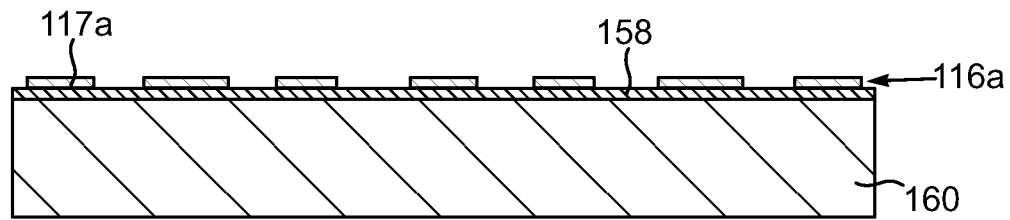
FIG. 5 is a sectional view depicting initial fabrication of an RDL structure on a carrier wafer.

An exemplary method for fabricating the semiconductor chip package 100 can be understood by referring now to FIGS. 5, 6, 7, 8, 9, 10 and 11 and initially to FIG. 5. FIG. 5 is a sectional view that depicts the commencement of the fabrication of the metallization layer 116a of the RDL structure 115 depicted in FIG. 1. Here, a release layer 158 is applied to a carrier wafer 160. It should be understood that this fabrication process can be performed at the wafer level such that carrier wafer 160 is much larger than what is depicted and the multiple RDL structures can be fabricated en masse. The release layer 158 can be a light activated, thermally activated, or other type of adhesive or even some form of tape that can enable the carrier wafer 160 to be removed without destructively damaging the structures mounted thereon at the time of separation. The carrier wafer 160 can be composed of various types of glasses or even semiconductors, such as silicon. Following the fabrication of a release layer 158, the metallization traces and/or pads 117a of the metallization layer 116a are fabricated on the release layer 158. This can be performed as an additive or a subtractive process, such as plating, sputtering and etching or other, and using the materials disclosed elsewhere herein.

Figure 6:
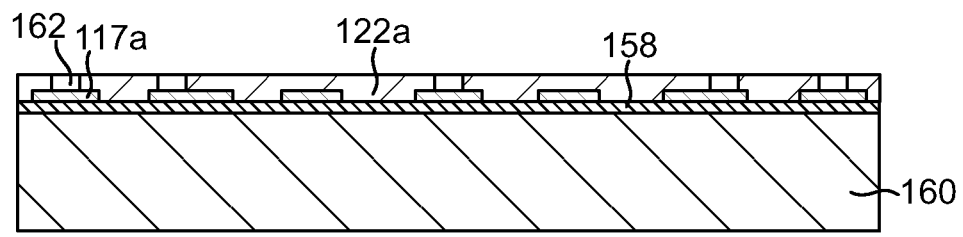
FIG. 6 is a sectional view like FIG. 5 but depicting additional processing of the RDL structure.

Next, as shown in FIG. 6, the polymer layer 122a is fabricated over the metallization traces 117a and the otherwise exposed portions of the release layer 158 all with the carrier wafer 160 still in place. Following the application of the polymer layer 122a, suitable openings 162 are fabricated in the polymer layer 122a leading to various of the conductor traces 117a. The fabrication of the openings 162 can be by way of photolithography where the polymer layer 122a includes photoactive compounds and can be patterned using exposure and development. Optionally, laser drilling or even etch processes could be used to form the openings 162. The polymer layer itself 122a can be applied by well-known spin coating and baking techniques or other polymer layer application techniques.

Figure 7:
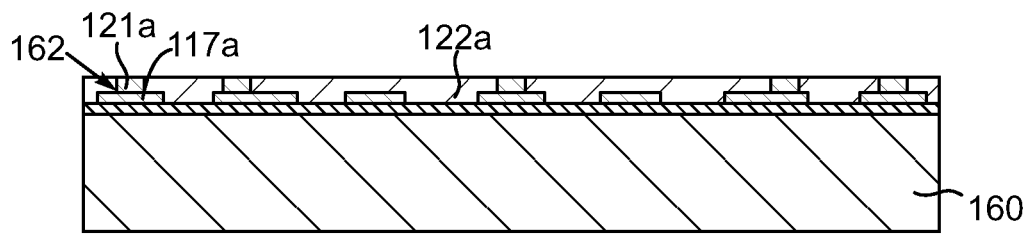
FIG. 7 is a sectional view like FIG. 6 but depicting additional processing of the RDL structure.
Figure 8:
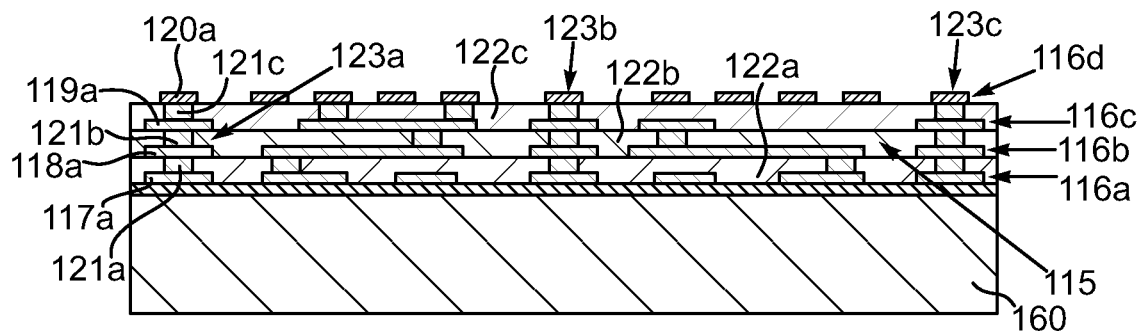
FIG. 8 is a sectional view like FIG. 7 but depicting additional processing of the RDL structure.

Next and as shown in FIG. 7, the vias 121a are fabricated in the openings 162 by way of well-known plating processes with the carrier wafer 160 still in place. The vias 121a could also be fabricated using sputtering followed by etching.

The process steps depicted in FIGS. 5, 6 and 7 and described above, are repeated as shown in FIG. 8 over several times in order to fabricate the polymer layers 122b and 122c and the conductor traces and/or pads 118a, 119a and 120a of the metallization layers 116b, 116c and 116d and the vias 121b and 121c and thus complete the RDL structure 115, all with the carrier wafer 160 in place. The rivets 123a, 123b and 123c are concurrently fabricated.

Figure 9:
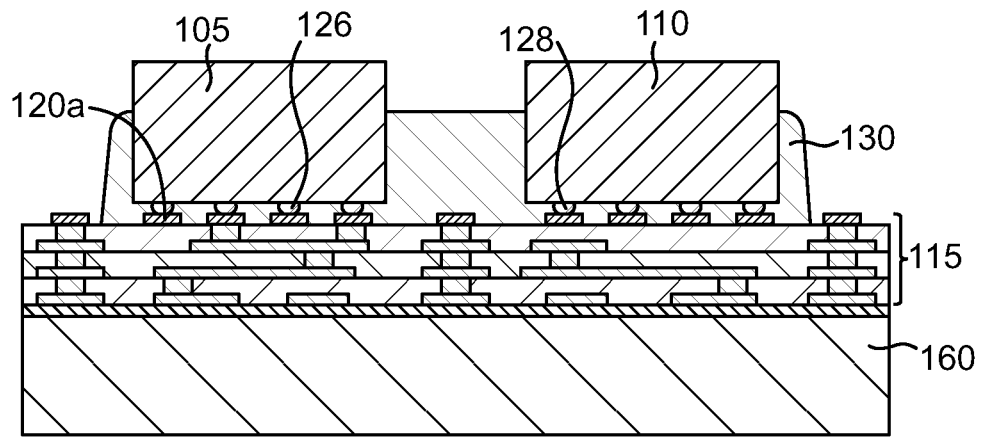
FIG. 9 is a sectional view like FIG. 8 but depicting exemplary semiconductor chip mounting and underfill application.

Next and as shown in FIG. 9, the semiconductor chips 105 and 110 are mounted on the RDL structure 115 and secured thereto by way of metallurgical bonds between the interconnects 126 and 128 of the chips 105 and 110 and various of the conductor traces and/or pads 120a of the metallization layer 116d. Thereafter, the underfill 130 can be applied to the RDL structure 115 to flow beneath the chips 105 and 110 and around the chips 105 and 110. This underfill 130 can be applied by capillary action or by molding if desired. The underfill 130 could also be applied first and thereafter the chips 105 and 110 can be dropped therethrough and a reflow performed.

Figure 10:
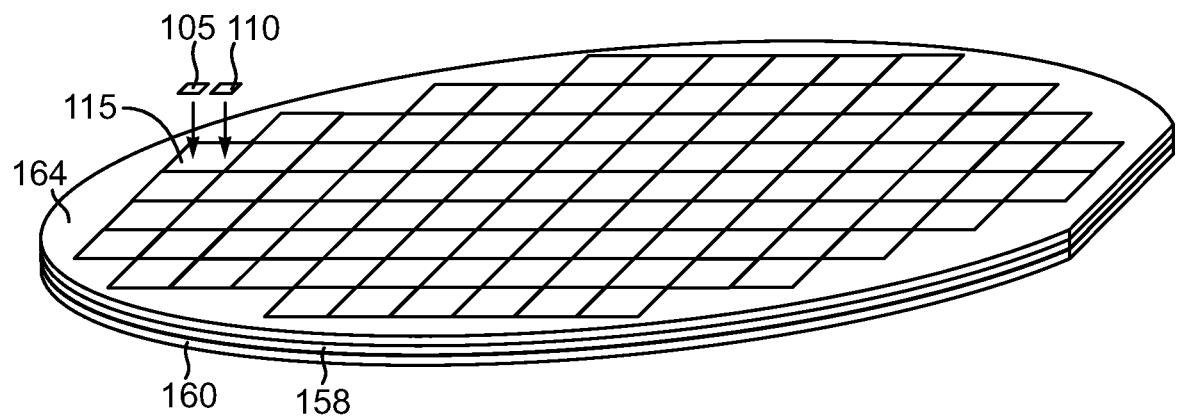
FIG. 10 is a pictorial view of an exemplary reconstituted wafer incorporating plural RDL structures.

The fabrication of the RDL structure 115, the mounting of the semiconductor chips 105 and 110 thereon and other processes for this and the other disclosed arrangements can be performed on a wafer level as depicted in FIG. 10, which shows a global RDL structure layer 164, including the RDL structure 115 and others like it, fabricated on the release layer 158 and the carrier wafer 160. The RDL structures 115 will be singulated in subsequent processing.

Figure 11:
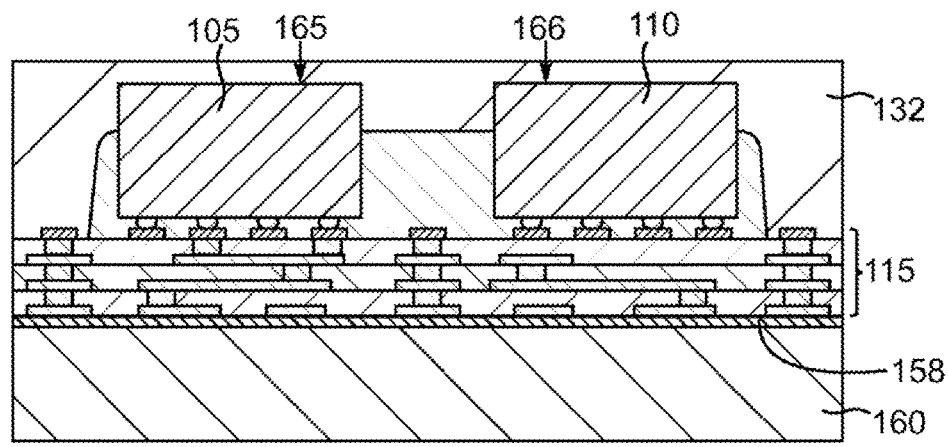
FIG. 11 is a sectional view like FIG. 9 but depicting exemplary molding layer application.

Next and as shown in FIG. 11, the molding layer 132 is molded on the RDL structure 115 to at least partially encapsulate the chips 105 and 110. Here, the molding layer 132 covers the upper surfaces 165 and 166 of the chips 105 and 110. However, the molding layer 132 can be subjected to a subsequent grinding process to reveal the upper surfaces 165 and 166 if desired for engagement with some sort of thermal solution (not shown). The release layer 158 is deactivated to detach the carrier wafer 160 from the RDL structure 115. The deactivation is by way of whatever techniques are appropriate, such as, light, heat, etc. After the removal of the carrier wafer 160 shown in FIG. 11, a variety of processes are performed to establish the solder resist layer 136 again using well-known spin coating and baking techniques, photolithography to establish the aforementioned openings (not shown) and pick and place or other techniques to fabricate the interconnects 134 shown in FIG. 1. Following these steps, the semiconductor chip package 100 can be singulated from a reconstituted wafer. The grinding process can be performed on the molding layer 132 to expose the upper surfaces 165 and 166 of the chips 105 and 110. Optionally, the grinding of the molding layer 132 can precede removal of the carrier wafer 160.

Figure 12:
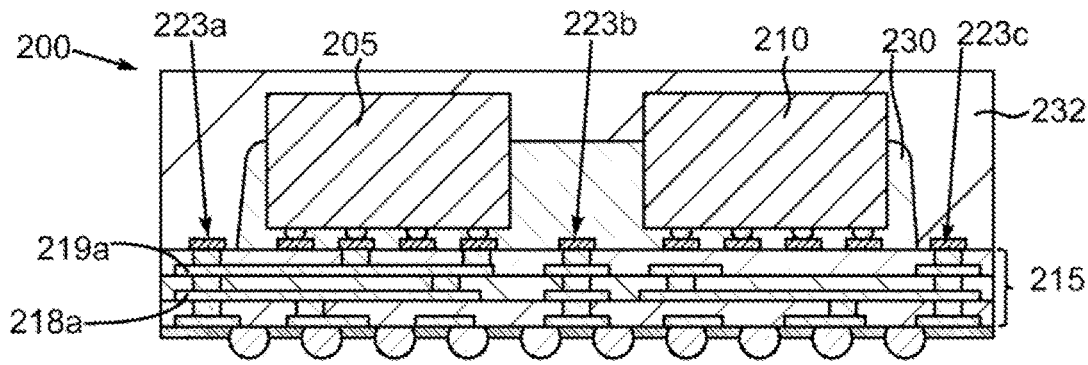
FIG. 12 is a sectional view like FIG. 11 but depicting exemplary RDL interconnect fabrication.

An alternate exemplary semiconductor chip package 200 can be understood by referring now to FIG. 12, which is a sectional view like FIG. 1. Here, the semiconductor chip package 200 shares many attributes with the semiconductor chip package 100 depicted in previous figures and described above. For example, semiconductor chip package 200 can include semiconductor chips 205 and 210 mounted on a RDL structure 215, an underfill 230 and a molding layer 232. However, in this illustrative arrangement, the RDL structure 215 includes rivets 223a, 223b and 223c where some of the rivets, for example 223a and 223c, are not electrically isolated and discrete structures. Instead, the rivet 223a includes conductor traces and/or pads 218a and 219a that serves as shank portions and also provide electrical routing for the RDL structure 215. The same applies to the other rivet 223b.

Figure 13:
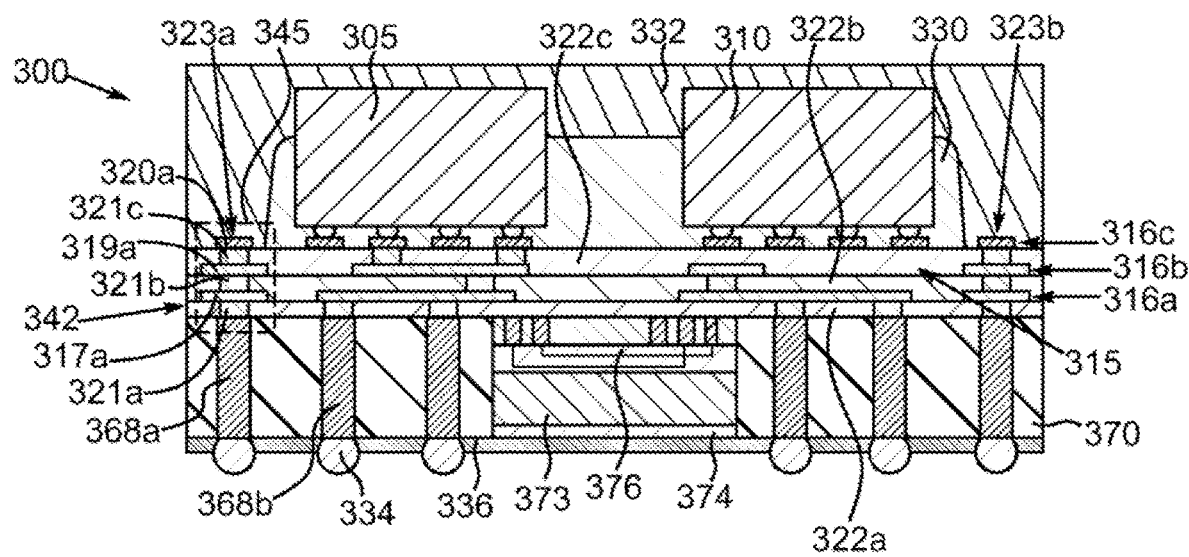
FIG. 13 is a sectional view like FIG. 1 but depicting an alternate exemplary arrangement of a semiconductor chip package that incorporates an interconnect chip.

Another alternate exemplary arrangement of a semiconductor chip package 300 can be understood by referring now to FIG. 13, which is a sectional view like FIGS. 1 and 12. This alternative arrangement of the semiconductor chip package 300 shares several attributes with the other disclosed arrangements, namely, semiconductor chips 305 and 310 mounted on a RDL structure 315 with an underfill 330 and a molding layer 332. The RDL structure 315 similarly includes plural metallization layers 316a, 316b and 316c. The metallization layer 316a includes conductor traces and/or pads 317a, the metallization layer 316b includes conductor traces and/or pads 319a and the metallization layer 316c includes conductor traces and/or pads 320a. Plural vias 321a, 321b and 321c provide interlevel connections. However, this is a via first process, so the vias 321a are fabricated beneath the metallization layer 316a. In addition, the semiconductor chip package 300 can interface electrically with some other structure by way of interconnects 334 which project from a polymer layer 336. However, this illustrative arrangement utilizes relatively tall conductive pillars, a couple of which are numbered 368a and 368b, respectively, that are fabricated in a molding layer 370. The conductive pillars 368a and 368b are relatively tall and the molding layer 370 is relatively thick in order to accommodate the placement of an optional interconnect chip 373, which is designed to provide a high density cross link between the semiconductor chips 305 and 310 for high speed signal transmission also by way of the RDL structure 315. The interconnect chip 373 is connected to the polymer layer 336 by way of a die attach film 374 and includes an interconnect structure 376, which includes traces and vias to ultimately connect to conductor structures of the RDL structure 315. In this illustrative arrangement, various of the conductive pillars 368a serve as the lower heads for the rivets 323a and 323b. For example, the rivet 323a includes one of the conductive pillars 368a, which serves as a lower head and one of the conductor traces and/or pads 320a, which serves as the upper rivet head while the various vias 321a, 321b and 321c and conductive traces 317a and 319a function as the rivet shank. The same applies to the rivet 323b, albeit at the other side of the package 300. Because the conductive pillar 368a for the rivet 323a is positioned beneath the polymer layer 322a, the rivet 323a also protects against the delamination of the polymer layer 319a from the underlying molding layer 370. Other pillars 368b provide electrical routing.

Figure 14:
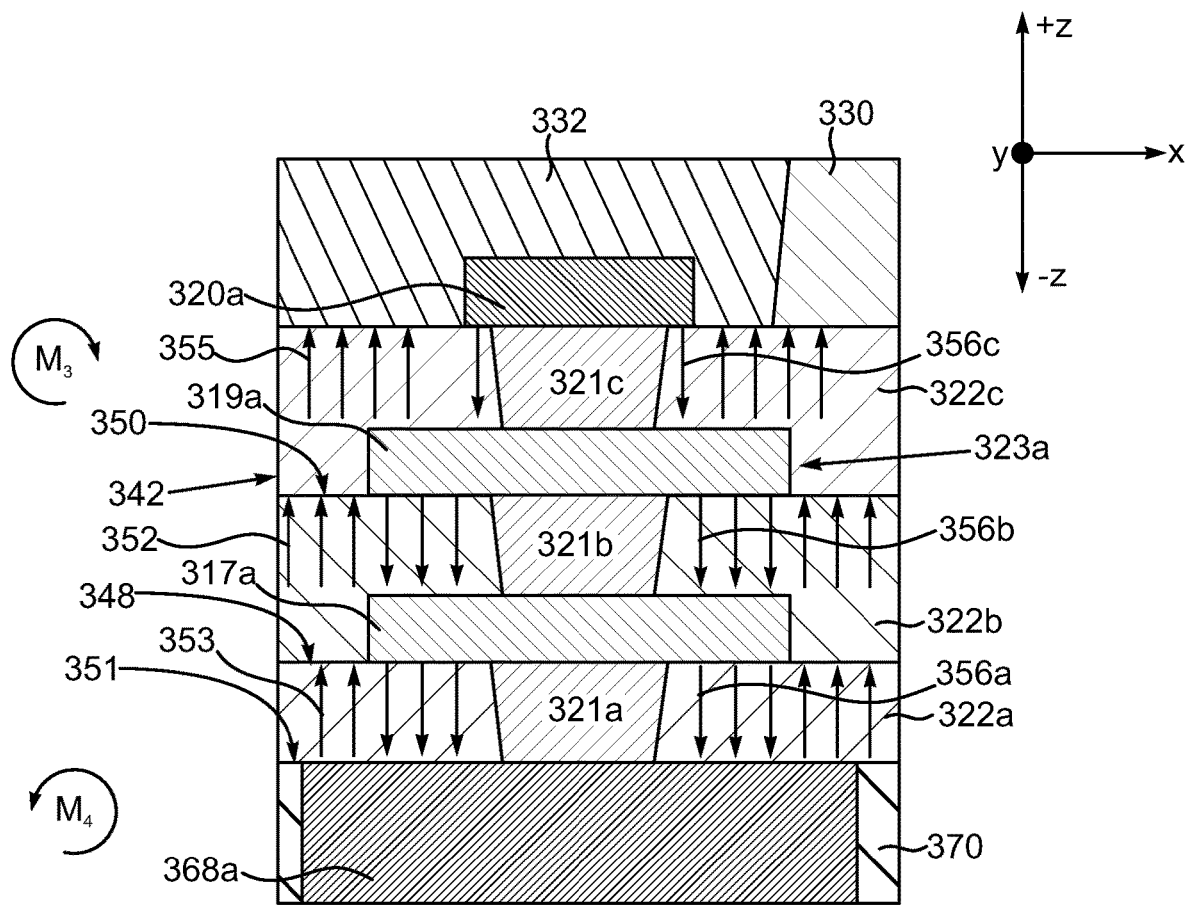
FIG. 14 is a portion of FIG. 13 shown at greater magnification.

Additional details of the rivet 323a can be understood by referring now also to FIG. 14, which depicts the portion of FIG. 13 circumscribed by the dashed rectangle 345, albeit at greater magnification. The following discussion of the rivet 323a will be illustrative of the other rivets 323b and others as well. Note that because of the location of the dashed rectangle 345 in FIG. 13, FIG. 14 depicts the rivet 323a and small portions of the polymer layers 322a, 322b and 322c, the underfill 330, the molding 332, a portion of the conductive pillar 368a and a portion of the molding layer 370. As noted above, a typical rivet includes a shank connected to two oppositely positioned heads. For the rivet 323a, the conductive pillar 368a serves as a rivet head and one of conductor traces and/or pads 320a serves as the other rivet head. The combination of the conductive vias 321a, 321b and 321c and the conductor traces and/or pads 317a and 319a function as the shank of the rivet 323a. The conductor structures of the rivet 323a are metallurgically bonded and make up a mechanical structure capable of resisting tensile stresses, for example, along the z axis. This illustrative arrangement of the rivet 323a functions similarly to the rivet 123a described above. However the rivet 323a is designed to provide delamination protection, particularly at the edge 342, for the interface 348 between the polymer layer 322a and the polymer layer 322b, the interface 350 between the polymer layer 322b and the polymer layer 322c and also the interface 351 between the polymer layer 322a and the molding layer 370. If the warpage produces a bending moment $M_3$, then the polymer layers 322a, 322b and 322c will have a tendency to warp particularly at the edge 342 in the +z direction and exert positive +z direction forces 352, 353 and 355. These +z direction forces 352, 353 and 355 are opposed by −z direction forces 356a, 356b and 356c from the conductor traces and/or pads 317a, 319a and 320a, with the conductive pillar 368a as rivet head and anchor. Here, the conductive pillar 368a functions as one of the rivet heads and thus counteracts potential delamination of the polymer layer 322a from the underlying molding layer 370. Of course, the opposite mechanism will be exhibited if an opposite bending moment $M_4$ produces −z direction forces.

Figure 15:
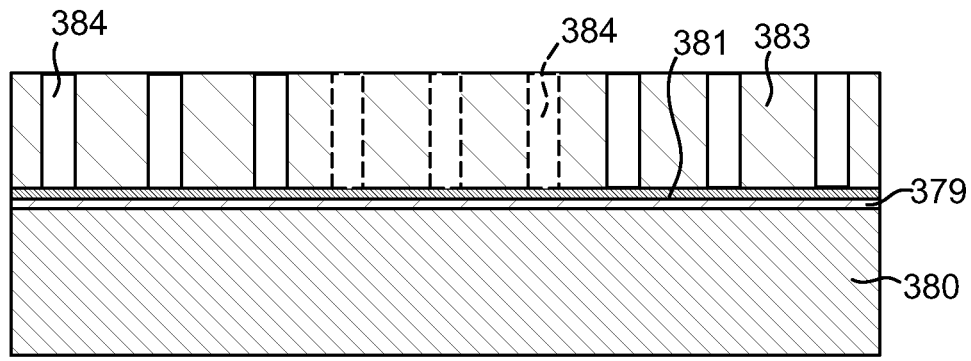
FIG. 15 is a sectional view depicting initial processing to fabricate conductive pillars on a carrier wafer.

An exemplary method for fabricating the semiconductor chip package 300 can be understood by referring now also to FIGS. 15, 16, 17, 18, 19, 20, 21 and 22 and initially to FIG. 15. FIG. 15 is a sectional view depicting the commencement of the fabrication of the conductive pillars 368a and 368b shown in FIG. 13. Initially, a release layer 379 is applied to a carrier wafer 380. The release layer 379 can be configured like the release layer 158 described above in conjunction with FIG. 5. Next, a plating seed layer 381 is applied to the release layer 378. The plating seed layer 381 can be composed of a variety of materials that are suitable for plating seed layers, such as copper or the like, and applied by well-known sputtering, chemical vapor deposition, electroless plating or the like. A photolithography mask 383 is applied to the plating seed layer 281 and patterned photolithographically to produce plural openings 384, which will be used to plate the conductive pillars 368a and 368b shown in FIG. 13. The photolithography mask 383 can be composed of negative tone or positive tone resist as desired. Note that some of the openings 384 are not in the same plane as others and thus are shown in phantom. The openings 384 shown in phantom will be the locations where, for example, conductive pillars 368b shown in FIG. 13 that are behind the interconnect chip 373 will be mounted.

Figure 16:
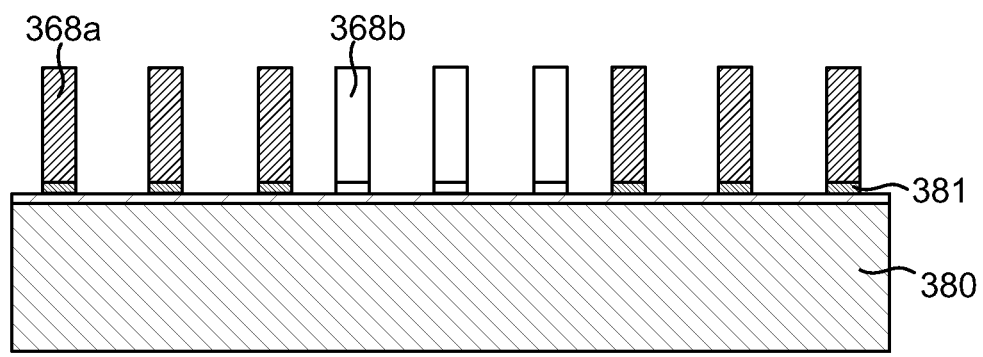
FIG. 16 is a sectional view like FIG. 15 but depicting additional processing of the conductive pillars.

Next and as shown in FIG. 16, a plating process is performed to establish the conductive pillars 368 with the carrier wafer 380 in place. As noted above, some of the conductive pillars 368 are not in the same plane as others and thus are not shown in section in FIG. 16. The photoresist mask 383 depicted in FIG. 15 and used to plate the conductive pillars 368a and 368b is subsequently stripped using well-known ashing and solvent stripping techniques. Portions of the plating seed layer 381 lateral to the pillars 368a and 368b are etched away.

Figure 17:
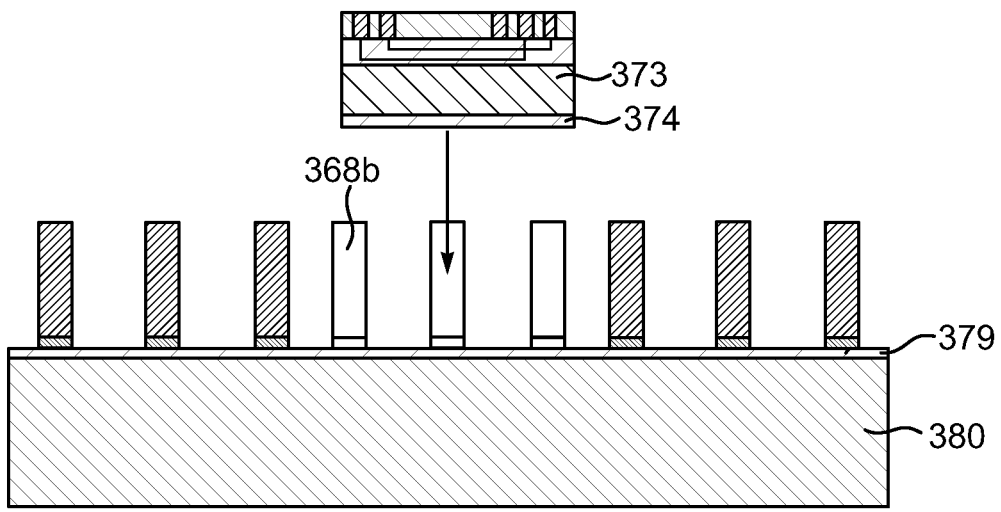
FIG. 17 is a sectional view like FIG. 16 but depicting exemplary interconnect chip mounting.

Next and as shown in FIG. 17, the interconnect chip 373, which has been fabricated using a variety of well-known processes, is mounted with the die attach film 374 thereof facing downwards on the release layer 379 with the carrier wafer 380 in place. Note again that the conductive pillars 368b, which are not cross hatched, are actually positioned deeper into the page than the interconnect chip 373 during and subsequent to this mounting process.

Figure 18:
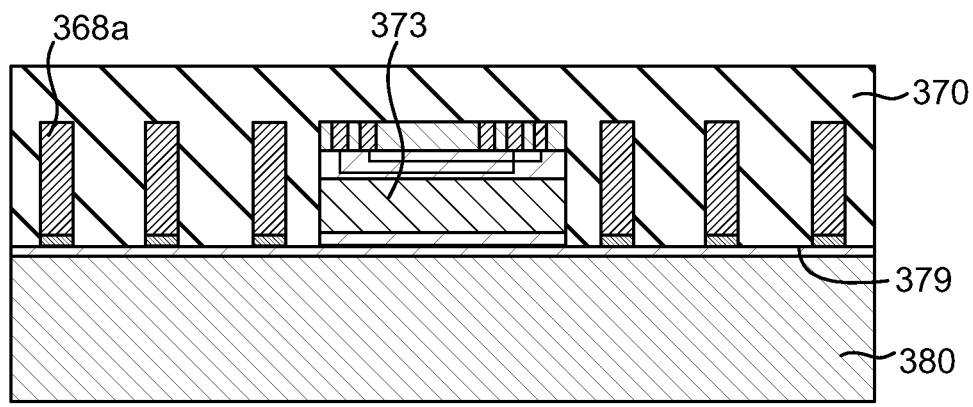
FIG. 18 is a sectional view like FIG. 17 but depicting exemplary fabrication of a molding layer over the conductive pillars and the interconnect chip.

Next and as shown in FIG. 18, the molding layer 370 is fabricated over the conductive pillars 368 and the interconnect chip 373 with the carrier wafer 380 in place. The molding layer 370 is preferably molded to cover the tops of the conductive pillars 368 as shown in FIG. 17. Well-known compression molding techniques and the materials disclosed elsewhere herein can be used.

Figure 19:
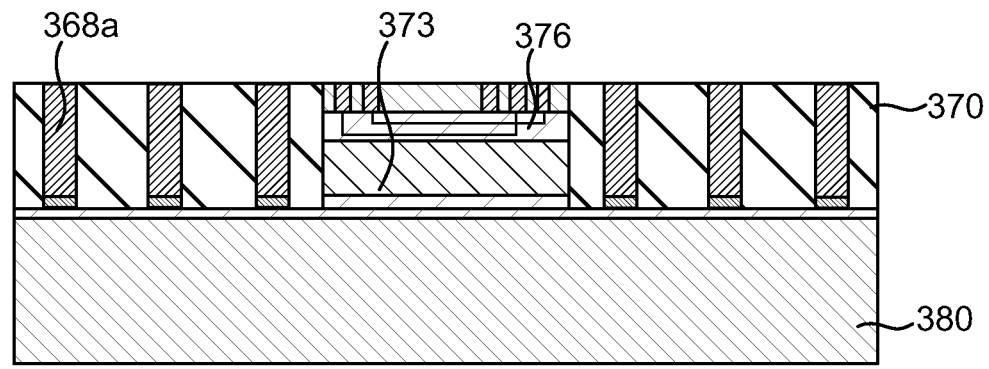
FIG. 19 is a sectional view like FIG. 18 but depicting an exemplary molding grinding process.

Next and as shown in FIG. 19, a suitable grinding process can be performed on the molding layer 370 to expose the tops of the conductive pillars 368a and 368b (not visible) with the carrier wafer 380 in place. In addition, the interconnect structure 376 of the interconnect chip 373 is similarly exposed.

Figure 20:
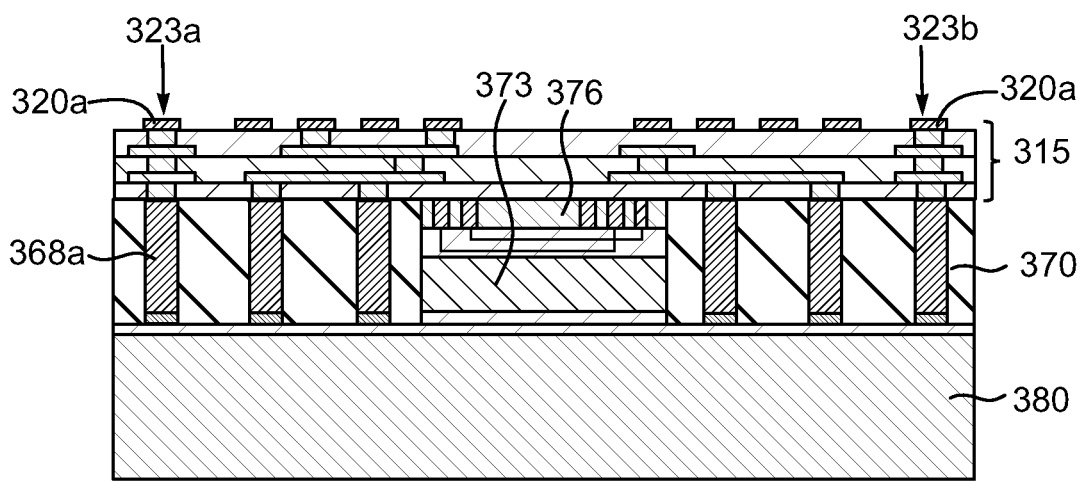
FIG. 20 is a sectional view like FIG. 19 but depicting exemplary RDL structure fabrication on the molding layer.

Next and as shown in FIG. 20, the RDL structure 315 is fabricated on the molding layer 370 with the carrier wafer 380 in place such that various conductor structures of the RDL structure 315 are fabricated in metallurgical contact with the conductive pillars 368a and 368b (not visible) and the interconnect structure 376 of the interconnect chip 373. The fabrication steps for the fabrication of the RDL structure 115 shown in FIG. 1 can be used to construct the RDL structure 315. Of course, the fabrication of the RDL structure 315 encompasses the creation of the rivets 323a, 323b, etc. with some of the conductor traces 320a serving as top rivet heads and some of the conductive pillars 368a serving as rivet bottom heads and the structures therein between of course serving as the rivet shanks as described generally above.

Figure 21:
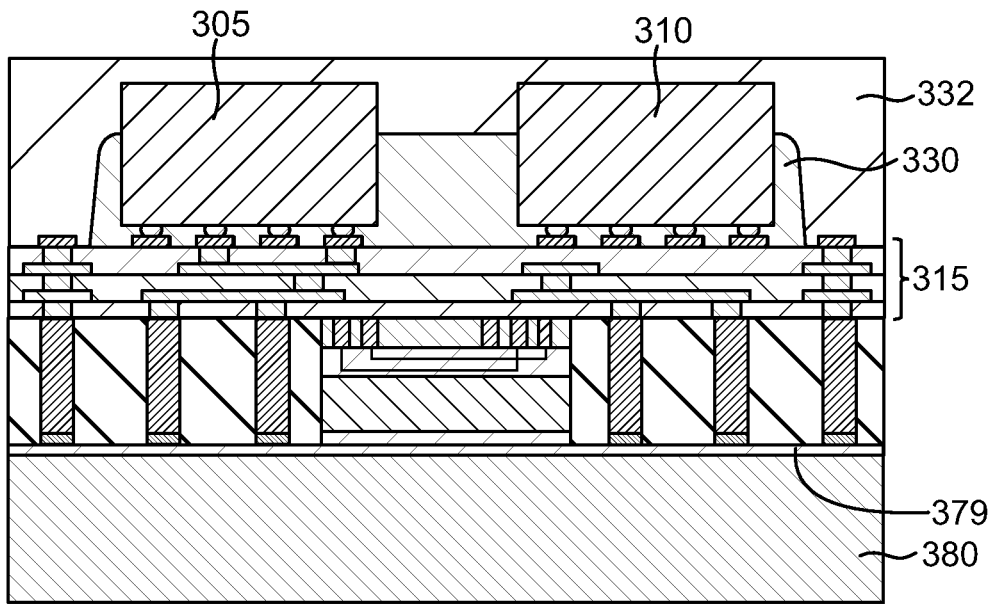
FIG. 21 is a sectional view like FIG. 20 but depicting exemplary semiconductor chip mounting and underfill on the RDL structure.

Next and as shown in FIG. 21, the semiconductor chips 305 and 310 are mounted on the RDL structure 315 using the same general techniques described above in conjunction with the semiconductor chips 105 and 110 and 205 and 210, the underfill 330 is applied using the techniques described above for the underfills 130 and 230 and the molding layer 332 is molded using the techniques described above for the molding layer 132 to at least partially encapsulate the semiconductor chips 305 and 310 and the underfill 330. Of course, and as noted above, a grinding process can be performed on the molding layer 332 in order to expose the upper surfaces of the semiconductor chips 305 and 310 if that is required or desirable for some sort of thermal solution.

Figure 22:
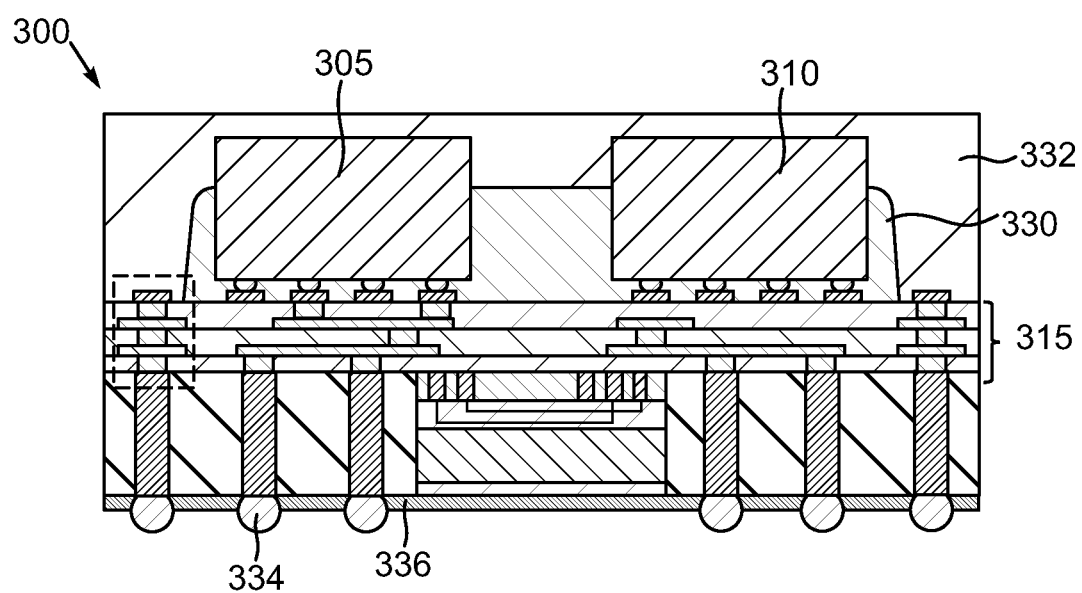
FIG. 22 is a sectional view like FIG. 21 but depicting exemplary molding layer application over the semiconductor chips.

Referring now to FIG. 22, the release layer 379 shown in FIG. 21 is deactivated to detach the carrier wafer 380 from the RDL structure 315. The deactivation is by way of whatever techniques are appropriate, such as, light, heat, etc. After the removal of the carrier wafer 380 as shown in FIG. 22, a variety of processes are performed to establish the solder resist layer 336 again using well-known spin coating and baking techniques, photolithography to establish the aforementioned openings (not shown) and pick and place or other techniques to fabricate the interconnects 334. Following these steps, the semiconductor chip package 300 can be singulated from a reconstituted wafer. The grinding process can be performed on the molding layer 332 to expose the upper surfaces of the chips 305 and 310. Optionally, the grinding of the molding layer 332 can precede removal of the carrier wafer 380.

Figure 23:
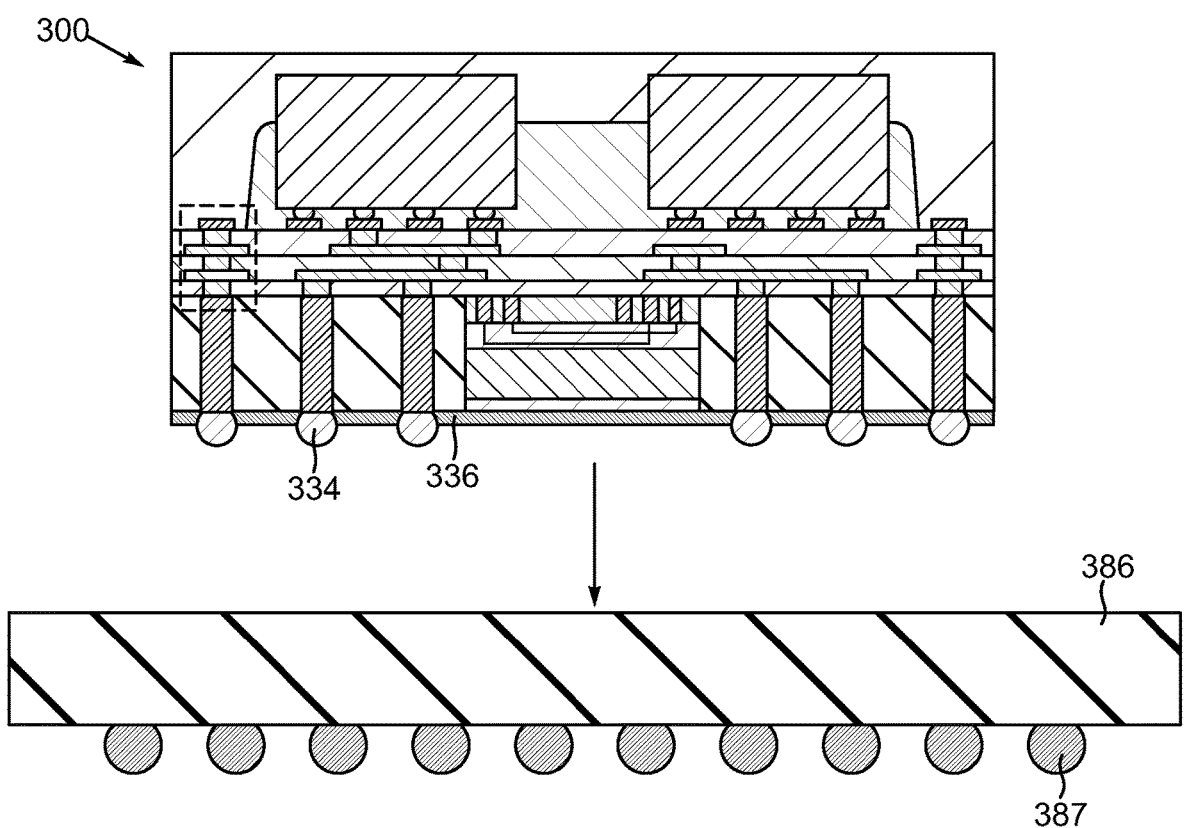
FIG. 23 is a sectional view depicting exemplary mounting of the exemplary semiconductor chip package on a circuit board.

Next and as shown in FIG. 23, the semiconductor chip package 300 can be mounted on another circuit board 386. The circuit board 386 can be another package substrate, a motherboard, a circuit card, or virtually any other type of printed circuit board, and include interconnects 387 designed to electrically interface with yet some other electronic structure such as another circuit board or other. The interconnects 334 of the package 300 electrically connect to the circuit board 386. The same type of mounting process to another circuit board like the circuit board 386 can be used for the other disclosed semiconductor chip package arrangements 100 and 200.

Figure 24:
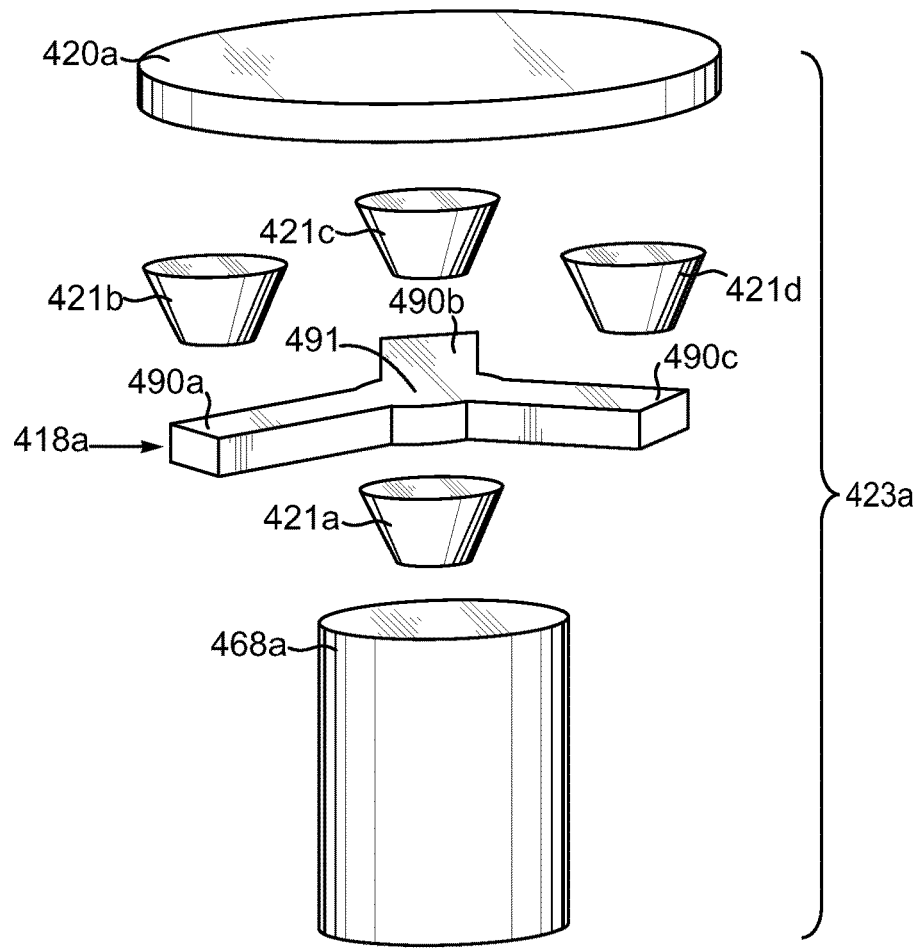
FIG. 24 is an exploded pictorial of an alternate exemplary reinforcing rivet.

As noted above, various shapes can be used to construct reinforcing rivets. FIG. 24 depicts an exploded pictorial view of an alternate exemplary rivet arrangement. Here, a combination of a conductor pad and/or trace 418a and conductive vias 421a, 421b, 421c and 421d make up a shank of an exemplary rivet 423a, while a conductor pad 420a and a conductive pillar 468a make up the respective rivet heads. The conductor pad and/or trace 418a and conductive vias 421a, 421b, 421c and 421d that make up a shank of the exemplary rivet 423a can be constructed as part of a RDL structure (not shown) as described above. The via 421a is fabricated on the conductive pillar 468a and the conductor pad and/or trace 418a is fabricated on the conductive via 421a. Here the conductor pad and/or trace 418a is fabricated as a hub and spoke arrangement with spokes 490a, 490b and 490c projecting from a hub 491. There are three spokes 490a, 490b and 490c, but there could be other numbers. The conductive vias 421b, 421c and 421d are fabricated on respective of the spokes 490a, 490b and 490c. The conductor pad 420a is fabricated on the conductive vias 421b, 421c and 421d with a footprint large enough to metallurgically bond to the vias 421b, 421c and 421d. Additional trace and via layers could be used. The same materials and processes for the components of the rivets 123a can be used for the rivet(s) 423a as well.

Figure 25:
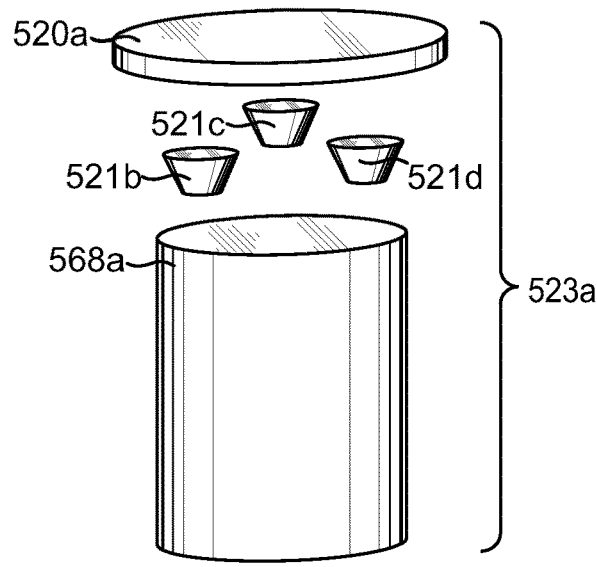
FIG. 25 is an exploded pictorial of another alternate exemplary reinforcing rivet.

FIG. 25 depicts an exploded pictorial view of another alternate exemplary rivet arrangement. Here, a combination of a conductor pad and/or trace 520a makes up a rivet head and conductive vias 521b, 521c and 521d make up a shank of an exemplary rivet 523a, while a conductive pillar 568a makes up the other rivet head. The conductor pad and/or trace 520a and the conductive vias 521b, 521c and 521d can be constructed as part of a RDL structure (not shown) as described above. The conductive vias 521b, 521c and 521d are fabricated on the conductive pillar 568a and the conductor pad and/or trace 520a is fabricated on the conductive vias 521b, 521c and 521d. There are three conductive vias 521b, 521c and 521d, but there could be other numbers. The conductive vias 521b, 521c and 521d are fabricated with a small enough footprint and/or the conductive pillar 568a is fabricated with a large enough footprint so that the conductive vias 521b, 521c and 521d fit on the area of the conductive pillar 568a. The conductor pad 520a is fabricated on the conductive vias 521b, 521c and 521d with a footprint large enough to metallurgically bond to the vias 521b, 521c and 521d. Additional trace and via layers could be used. The same materials and processes for the components of the rivets 123a can be used for the rivet(s) 523a as well.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip package, comprising:
a fan-out redistribution layer (RDL) structure including plural stacked polymer layers, plural metallization layers, plural conductive vias that bond together adjacent metallization layers of the metallization layers, a rivet configured to resist delamination of one or more of the polymer layers, wherein the rivet includes a shank comprising at least one of the conductive vias, the shank traversing at least two of metallization layers.

2. The semiconductor chip package of claim 1, wherein the rivet includes a first head and a second head, the shank connected between the first head and the second head, the first head being part of a metallization layer.

3. The semiconductor chip package of claim 2, further comprising a molding layer including plural conductive pillars, the fan-out RDL structure being positioned on the molding layer wherein the conductive pillars are connected to one of the metallization layers, each of the second heads being one of the conductive pillars.

4. The semiconductor chip package of claim 3, further comprising an interconnect chip positioned in the molding layer.

5. The semiconductor chip package of claim 2, wherein each of the shanks includes one conductor trace of another of the metallization layers.

6. The semiconductor chip package of claim 2, wherein the second head is part of another metallization layer.

7. The semiconductor chip package of claim 1, further comprising one or more semiconductor chips mounted on the fan-out RDL structure.

8. The semiconductor chip package of claim 7, further comprising a molding layer positioned on the fan-out RDL structure and at least partially encapsulating the one or more semiconductor chips.

9. The semiconductor chip package of claim 1, wherein the rivet is electrically floating.

10. The semiconductor chip package of claim 1, wherein the rivet is not electrically floating.

11. The semiconductor chip package of claim 1, wherein each of the metallization layers includes plural conductor pads and conductor traces.

12. A method of manufacturing, comprising:
fabricating a fan-out redistribution layer (RDL) structure including plural stacked polymer layers, plural metallization layers, plural conductive vias interconnecting adjacent metallization layers of the metallization layers, and a rivet configured to resist delamination of one or more of the polymer layers; and
bonding together the conductive vias and at least one part of the metallization layers to form the rivet that reinforces the RDL structure against delamination of one or more of the polymer layers, wherein the rivet includes a shank comprising at least one of the conductive vias, the shank traversing at least two of the metallization layers.

13. The method of claim 12, wherein the rivet includes a first head and a second head, the shank connected between the first head and the second head, the first head being part of a metallization layer.

14. The method of claim 13, further comprising fabricating a molding layer including plural conductive pillars, the fan-out RDL structure being positioned on the molding layer wherein the conductive pillars are connected to one of the metallization layers, each of the second heads being one of the conductive pillars.

15. The method of claim 14, further comprising positioning an interconnect chip in the molding layer.

16. The method of claim 13, wherein the second head is part of another metallization layer.

17. The method of claim 12, further comprising mounting one or more semiconductor chips on the fan-out RDL structure.

18. The method of claim 17, further comprising fabricating a molding layer on the fan-out RDL structure and at least partially encapsulating the one or more semiconductor chips.

19. The method of claim 12, wherein the rivet is electrically floating.

20. The method of claim 12, wherein the rivet is not electrically floating.

* * * * *